United States Patent [19]

Koerner et al.

[11] Patent Number: 5,478,780
[45] Date of Patent: Dec. 26, 1995

[54] METHOD AND APPARATUS FOR PRODUCING CONDUCTIVE LAYERS OR STRUCTURES FOR VLSI CIRCUITS

[75] Inventors: Heinrich Koerner, Bruckmuehl; Helmuth Treichel, Augsburg; Konrad Hieber, Neukeferloh; Peter Kuecher, Munich, all of Germany

[73] Assignee: Siemens Aktiengesellschaft, Munich, Germany

[21] Appl. No.: 851,245

[22] Filed: Mar. 13, 1992

Related U.S. Application Data

[63] Continuation-in-part of Ser. No. 677,119, Mar. 29, 1991, abandoned.

[30] Foreign Application Priority Data

Mar. 30, 1990 [EP] European Pat. Off. ............... 90106139

[51] Int. Cl.$^6$ ...................... H01L 21/283; H01L 21/285
[52] U.S. Cl. ........................... 437/190; 437/194; 437/192; 437/926
[58] Field of Search .................................. 437/188, 192, 437/194, 197, 200, 190, 201, 926

[56] References Cited

U.S. PATENT DOCUMENTS

| | | | |
|---|---|---|---|
| 4,585,517 | 4/1986 | Stemple | 156/643 |
| 4,825,808 | 5/1989 | Takahashi et al. | 118/719 |
| 4,951,601 | 8/1990 | Maydan et al. | 118/715 |
| 4,985,372 | 1/1991 | Narita | 437/192 |
| 5,010,032 | 4/1991 | Tang et al. | 437/57 |
| 5,066,611 | 11/1991 | Yu | 437/173 |
| 5,094,981 | 3/1992 | Chung et al. | 437/190 |
| 5,188,979 | 2/1993 | Filipiak | 437/192 |
| 5,196,372 | 3/1993 | Mikoshiba et al. | 437/187 |
| 5,223,455 | 6/1993 | Itoh et al. | 437/192 |
| 5,232,872 | 8/1993 | Ohba | 437/192 |
| 5,242,860 | 9/1993 | Nulman et al. | 437/190 |
| 5,252,518 | 10/1993 | Sandhu et al. | 437/200 |
| 5,278,099 | 1/1994 | Maeda | 437/192 |
| 5,312,772 | 5/1994 | Yokoyama et al. | 437/190 |

FOREIGN PATENT DOCUMENTS

| | | |
|---|---|---|
| 0064805 | 11/1982 | European Pat. Off. |
| 0254035 | 1/1988 | European Pat. Off. |
| 0272141 | 6/1988 | European Pat. Off. |
| 0284794 | 11/1988 | European Pat. Off. |
| 2181297 | 4/1987 | United Kingdom |

OTHER PUBLICATIONS

"LPCVD TiN as Barrier Layer in VLSI" by N. Yokoyama et al 1046 Journal of the Electrochemical Society vol. 136, Mar. 1989, No. 3, p. 882.

"Sputterer Covers Steep Walls Evenly" by N. J. Parsippany, 8032 Electronics vol. 58, No. 37, Sep. 1985, p. 21.

"Silicon Take–Up by Aluminum Conductors Layered with Refractory Metals" by Kenji Hinode et al, IEEE Transactions on Electron Devices, vol–Ed–34, No. 3, Mar. 1987, pp. 700–705.

"Preparation & Characterization of Multiplayer Metallization Structures with Titanium Nitride & Titanium Silicide" by P. Panja et al, 2194 Thin Solid Films, vol. 181, No. 1, Dec. 10, 1989, pp. 35–41.

(List continued on next page.)

Primary Examiner—Olik Chaudhuri
Assistant Examiner—Richard A. Booth
Attorney, Agent, or Firm—Hill, Steadman & Simpson

[57] ABSTRACT

Methods and apparatus for producing conductive layers or structures for VLSI circuits. In a method for producing conductive layers or structures for VLSI circuits, at least two method stages are implemented in direct succession in different chambers of a high-vacuum system without interrupting the high-vacuum conditions for the semiconductor substrate. Avoiding exposure to air between the method stages produces noticeably improved layer properties and enables particularly simple and reliable multi-stage methods for producing conductive layers that promote a multi-layer wiring on the semiconductor substrate. An apparatus for implementing the method has a plurality of high-vacuum process chambers, at least one high-vacuum distributor chamber connecting the process chambers and of at least two high-vacuum supply chambers for semiconductor substrates.

3 Claims, 2 Drawing Sheets

OTHER PUBLICATIONS

"Novel self-aligned W/TiN TiSi$_2$ contact structure for very shallow junctions & interconnections" by R. V. Joshi et al, 320 Appl. Phy. Ltrs. vol. 54, No. 17, Apr. 24, 1989, pp. 1672–1674.

"Planarization Techniques for Multilevel Metallization" by A. N. Saxena et al, Solid State Technology, Oct. 1986, pp. 95–100.

"Chemical vapor deposition of aluminum from trimethylamine–alane" by David B. Beach et al, American Vacuum Society, Sep./Oct. 1989, pp. 3117–3118.

METHOD AND APPARATUS FOR PRODUCING CONDUCTIVE LAYERS OR STRUCTURES FOR VLSI CIRCUITS

This is a continuation-in-part of application Ser. No. 677,119 filed Mar. 29, 1991, now abandoned.

BACKGROUND OF THE INVENTION

The present invention is directed to a multi-stage method for manufacturing conductive layers or structures for VLSI circuits on a semiconductor substrate and is also directed to an apparatus for the implementation of the method.

In order to achieve an optimally high integration density in the manufacture of integrated circuits in microelectronics, it is known to arrange the conductive connections between the individual electrical elements of the integrated circuit in planes lying above one another (what is referred to as multi-layer wiring) and to simultaneously miniaturize the lateral dimensions of structures within a plane. The technical realization of this object requires a high degree of leveling of the vertical layer sequence, as set forth in detail in the article by A. Saxena and D. Pramanik in Solid State Technology, October, 1986, pages 95–100. A few methods of the prior art are also described in this article with which conductive and non-conductive layers and structures can be produced on a semiconductor substrate, usually a silicon substrate, these at least partially planarizing the semiconductor surface and, thus, making possible the multi-layer wiring.

What all known methods have in common is that a number of different methods must be implemented in succession in order to produce conductive connections that make possible the multi-layer wiring. This shall be set forth below with reference to the following example.

For producing interconnects, layers of aluminum or of aluminum alloy are usually applied to the surface of the semiconductor substrate with a sputtering process. Layers produced in this manner have a poor step coverage for narrow structures, for example through holes, as a result whereof height differences occur on the semiconductor surface. The sputtered aluminum layer must thereby be subjected to further treatment, for example a flowing of the existing surface by brief-duration heating, or the height difference must be compensated with a subsequently applied, non-conductive layer. In the former instance, the exposure of the aluminum layer to air which is necessary in the prior art leads to a passivating layer that contains aluminum oxide and makes the flowing process difficult. In the second instance, a number of involved methods must be utilized for the manufacture of a planarizing, insulating layer (for example, deposition of silicon oxide, spin-on of an auxiliary layer and curing, re-etching of the auxiliary layer and the silicon oxide layer, and repeated deposition of silicon oxide). This second alternative also has the disadvantage that the interconnects of the next conductive layer to follow cannot be arbitrarily arranged. In particular, the through holes that respectively connect two interconnect levels cannot be stacked above one another.

Improved step coverage of the deposited, conductive layers is therefore desirable both for reasons of electrical reliability of the interconnects as well as for promoting the multi-layer wiring. For this purpose, it is known to produce aluminum layers using a chemical deposition from the vapor phase (what is referred to as a CVD process).

Triisobutyl aluminum (TIBA) can thereby be employed as an initial substance. The method, however, involves considerable disadvantages (see D. Beach, S. Blum, F. LeGoues in Journal of Vacuum Science and Technology, A7(5), 1989, pages 3117–18): the dangerous nature of the initial compound given a low degree of conversion; instability of TIBA at temperatures above 50° C.; simple production of an aluminum alloy is impossible; low deposition rate that requires the use of a multi-wafer system (batch system); and necessity of a nucleation of the surface to be coated, the uniformity thereof on structured surfaces being hardly capable of being assured. Overall, this is an extremely complicated technological process that, produces aluminum layers having a high imperfection density and deficient electromigration resistance. In the above-recited article, the use of trimethylamine aluminum is proposed as an initial substance in a CVD process. However, in order to produce continuous aluminum layers with this process, a preceding nucleation with titanium chloride is also necessary and a uniformity of the aluminum layer is only guaranteed for a thickness greater than 200 nm.

Another problem, known as "spiking" occurs if the aluminum layer is connected to semiconductor substrates that contain silicon or polysilicon. Because of the solubility of silicon in aluminum, silicon diffuses into the aluminum conductor and precipitates out again at a later time. In the state of the art, the interdiffusion of silicon and aluminum is prevented by the deposition of a diffusion barrier formed of titanium nitride or titanium/tungsten, for instance, between the substrate and the aluminum layer at least in contact holes. A titanium nitride film can also promote the preferential development of a (111)-texture in the aluminum films that are subsequently deposited, which increases their stability and electromigration resistance. Titanium nitride films serve also as an adhesive and barrier film for tungsten filled contact holes. More details and a process for producing a titanium nitride film are explained in U.S. patent application Ser. No. 677,124, which is incorporated herein by reference.

SUMMARY OF THE INVENTION

It is therefore an object of the present invention to provide a method for producing conductive layers and structures for VLSI circuits which does not have the described disadvantages of the prior art methods. The layers and structures manufactured according to the present invention have the electrical and mechanical properties required for VLSI circuits and have a low contact resistance to underlying conductive layers as well as good step coverage. In particular, they promote multi-layer wiring, that is, they eliminate more involved methods for planarization of the semiconductor surface. Further, an apparatus is provided with which such a method can be implemented.

This object is achieved by a multi-stage method for producing conductive layers or structures for VLSI circuits on a semiconductor substrate. The conductive layer can completely cover the surface of the substrate or it can partially cover the surface as a structure. In the method at least two method stages are implemented in at least two chambers of a high-vacuum system while maintaining the high-vacuum conditions for the semiconductor substrate. In one embodiment, the method stages are the steps of applying a barrier layer onto the surface of the semiconductor substrate and applying an interconnect layer onto the barrier layer. Further method stages consist of the steps of applying a contact layer before applying the barrier layer, and/or cleaning the surface of the semiconductor substrate before applying the barrier layer or the contact layer, and/or applying a layer that supplies alloy constituents before, after or in interaction with the interconnect layer, and/or providing temperature treatment.

In one specific embodiment, the method stages are implemented as follows: plasma etching process for removing oxides; application of a titanium layer 10 nm through 100 nm thick on the basis of a sputtering process or by chemical deposition from a vapor phase (CVD process) at a temperature in the range from 200° C. through 450° C.; application of a titanium nitride layer with a CVD process at a temperature of 200° C. through 450° C. upon employment of a nitrogen-containing, organic titanium compound that is excited thermally and/or optically and/or with a plasma; application of an aluminum layer or of an aluminum alloy layer with a CVD process at a temperature from 200° C. through 450° C. upon employment of an organic aluminum compound that is excited thermally and/or optically and/or by a plasma; applying a metallic layer that contains copper, refractory metals palladium and/or silicon with a sputtering process or a CVD process in the thickness required for the desired alloy; brief-duration heating of the semiconductor substrate to a temperature up to 500° C. for 10 seconds through 120 seconds in an inert gas atmosphere (RTP or ROA process) for alloy formation.

In another embodiment, the method stages consist of pre-treatment of the surface of the semiconductor substrate to be coated, application of a metallic layer, and temperature treatment. In this embodiment, a further method stage is selective metal deposition. Furthermore, the method stage of selective metal deposition can be combined with the method stage of plasma etching. In a more specific embodiment, the method stages are executed as follows: bombardment with argon ions for removing oxides and for amorphization of the semiconductor substrate; application of a titanium or cobalt layer by sputtering from a metal target; brief-duration heating of the semiconductor substrate up to 700° C. in an inert gas atmosphere (RTP or ROA) for the formation of a silicide; and selective deposition of tungsten, copper or aluminum with a CVD process onto exposed silicon, silicide or metal.

An apparatus for the implementation of a multi-stage method for producing layers or structures for VLSI circuits on a semiconductor substrate, comprises a multi-chamber high-vacuum system having at least two process chambers, at least two supply chambers and at least one distributor chamber connecting the chambers to one another. All chambers and all connections between chambers are high-vacuum-compatible and enable the combination of a plurality of different method stages without interrupting the high-vacuum conditions for the semiconductor substrate. In the apparatus, a base pressure of less than $10^{-6}$ mbar (104 Pa) is provided for the supply chambers and a base pressure of less than $10^{-7}$ mbar ($10^{-5}$ Pa) is provided for the distributor and process chambers.

As a result of the multi-stage method of the present invention wherein a plurality of metallization-relevant method steps can be implemented in direct succession while maintaining high-vacuum conditions, conductive layers and structures can be produced that have noticeably improved electrical and mechanical properties and, in addition, that promote multi-layer wiring. As a result of the permanent presence of the semiconductor substrate in the high-vacuum and the exclusion of environmental influences connected therewith, such as oxygen or water vapor traces, and even between the method steps, the following advantages are obtained. The re-oxidation of newly cleaned surfaces is prevented, as a result whereof reproducibly low contact resistances are achieved and nucleation problems are avoided. The imperfection density in the deposit layers is reduced. The adhesion of the individual layers is improved and their mechanical stresses are reduced. Due to the prevention of a native oxide, an alloy constituent can be applied immediately after a deposited aluminum layer and can diffuse into the aluminum layer. The respective nucleation is significantly facilitated due to the suppressed formation of native oxide skins on the layers.

As a result of these improved layer properties, further methods can be integrated. These further methods can be implemented directly before or after an existing method in the same high-vacuum system without interrupting the high-vacuum conditions for the semiconductor substrate. The required process times, the risk of contamination of the semiconductor substrates to be handled and other problems due to external influences are thereby minimized.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in which like reference numerals identify like elements, and in which:

DESCRIPTION OF THE PREFERRED EMBODIMENT

Figure 1:
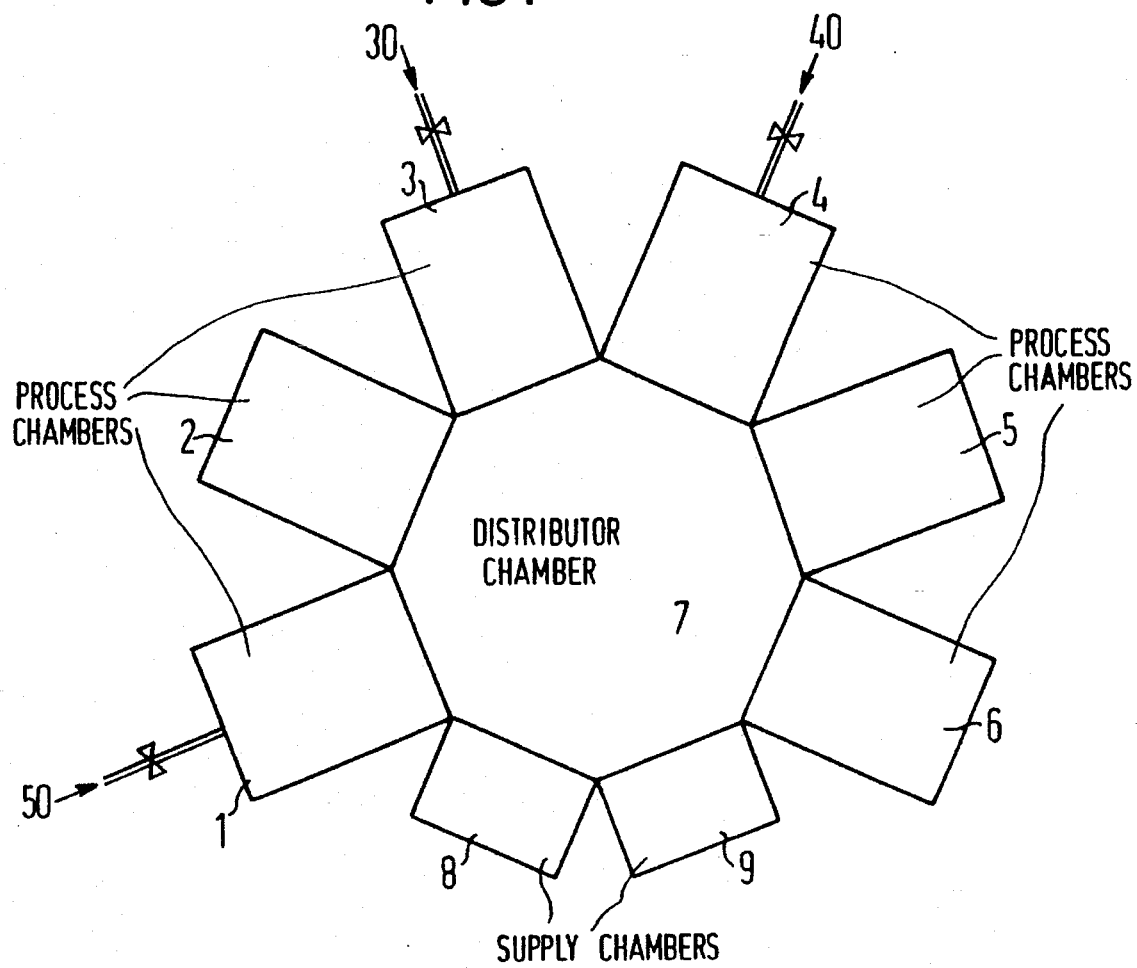
FIG. 1 is a schematic diagram of an exemplary embodiment of the apparatus of the present invention for implementing the method of the present invention.

The implementation of the multi-stage method of the present invention occurs in a high-vacuum system shown in FIG. 1 that is composed of at least two high-vacuum process chambers of chambers 1–6, of at least one high-vacuum distributor chamber 7 and of at least two high-vacuum supply chambers 8, 9. All supply and process chambers have a high-vacuum-compatible connection to the distributor chamber 7 that is centrally arranged in this exemplary embodiment and are insulated from and independent of one another in terms of high-vacuum. Given a maximum leak rate (unit: 100 Pa×1×sec$^{-1}$) as a first quantity, and a base pressure (unit: Pa) as a second quantity, the minimum that can be achieved in the individual chambers are: supply chambers ($5 \times 10^{-4}$ /$1 \times 10^{-6}$); distributor chamber ($5 \times 10^{-7}$/ $1 \times 10^{-5}$); process chambers ($5 \times 10^{-7}$/$1 \times 10^{-5}$). The individual process chambers 1 through 6 are specifically designed for individual processes and can have a volume that is relatively small. The silicon substrates to be processed, that are generally wafer-shaped and provided with partially finished integrated circuits, individually and quickly pass through the various process chambers 1 through 6 in succession or dwell in an in-process store of the distributor chamber 7 for matching the throughput times or process parameters. Execution and sequence of the individual process steps in the various process chambers are controlled by a process control computer (not shown).

For example, the individual process chambers 1 through 6 can be designed as follows: Chamber 1 can be a plasma etching chamber; chamber 2 can be a chamber for vapor-deposition of a metallic contacting layer; chamber 3 can be a chamber for CVD processes, for example for the deposition of a layer acting as barrier; chamber 4 can be a chamber for CVD deposition of a layer acting as interconnect; chamber 5 can be a chamber for sputtering a cover layer; and chamber 6 can be a chamber for a temperature step (RTP, RTA), potentially with optical assistance (ROA).

The chambers are thereby equipped with the apparatus known to be needed for the respective processes such as, for example, gas leads, electrodes for plasma etching methods or plasma-assisted deposition methods, metal targets, heating devices and the like.

The apparatus of the present invention is also suitable for multi-stage methods for producing non-conductive layers or, respectively, planarizing insulating layers between the interconnect levels. The process chambers 1 through 6 are then to be fashioned to meet the requirements (for example, for plasma-assisted CVD processes, sputter-etching methods, plasma etching methods, temperature treatments). As a result, a critical advantage is absorption of moisture by the insulating layers between the method steps is avoided, for example, a heating of the layers that is otherwise necessary becomes superfluous.

Short transfer times between two process chambers via the central distributor chamber 7 of approximately 20 seconds provides high throughput numbers without human influences or errors. While the silicon substrates from a supply chamber 8 are being processed, the other supply chamber 9 can be loaded with new silicon substrates from the outside. As a result thereof and as a result of employing a multi-chamber system having a central distributor chamber, a permanent, continuous processing for sequential execution of various methods is possible. Important economical and manufacturing aspects connected therewith are the reduction of the multitude of systems, saving utilized space in a clean room and assuring low throughput times.

Applied examples of the method of the present invention are as follows.

1. Manufacture of Aluminum Interconnects

Figure 2:
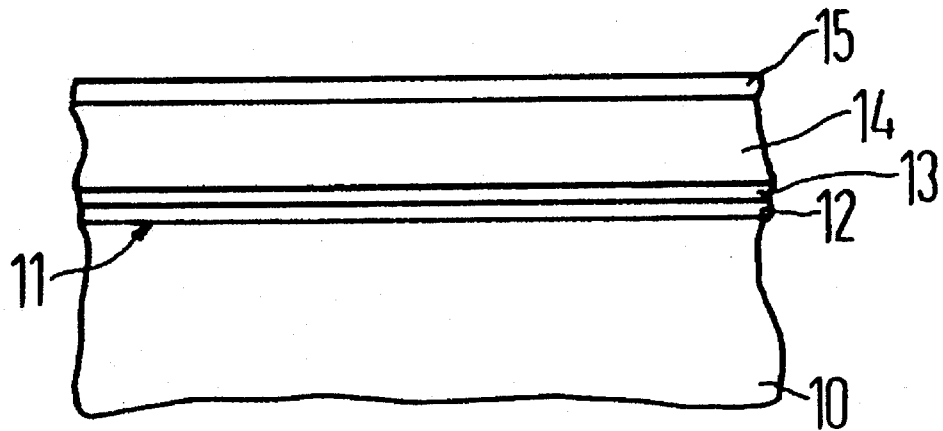
FIGS. 2 and 3 are sectional views of semiconductor substrates with several layers applied on them to explain different embodiments of the method of the present invention.

This multi-stage method shown in FIG. 2 is advantageously composed of the following method stages a1–a6.
(a1) Cleaning the surface 11 to be coated:

The native oxide of the exposed silicon surfaces 11 is removed by sputter etching or a plasma-assisted etching process in the first process chamber according to known methods, for example with $CF_4$ as an etching gas.
(a2) Applying a contact layer 12:

For improving the electrical contact with the underlying silicon regions, for example, a titanium layer 12 approximately 10 through 100 nm thick is applied as a contact layer. This can be implemented with known sputtering methods or CVD methods; the process chamber 2 is correspondingly constructed based on the desired manufacturing method. Given utilization of a CVD method, a suitable initial compound containing titanium is introduced into the process chamber 2 with a carrier gas or by imbibition and is thermally excited given a process pressure of 0.1 through 100 mbar (10 through 10,000 Pa) and given a temperature of approximately 200° C. through 450° C. An excitation with a plasma can additionally be provided.
(a3) Application of a barrier layer 13:

In order to prevent an inter-diffusion of aluminum and silicon, a titanium nitride layer 13 acting as a barrier is advantageously applied in a further process chamber 3. The underlying titanium layer 12 simultaneously serves as an adhesion layer for the barrier layer 13 composed of titanium nitride. In the present invention, a CVD process is utilized for producing the titanium nitride layer, this process employing a nitrogen-containing, organic titanium compound 30 as an initial substance that is thermally, optically or plasma-excited and which, given purely thermal excitation, provides for the addition of a reduction agent. At process temperatures in the range of 200° through 550° C., this method already supplies titanium nitride layers having especially advantageous properties such as conformity, low stress, extremely good step coverage, high barrier effect, good conductivity and the like.

For instance, the following classes of substances can be considered for use as initial substances;

1. $Ti(NR_2)_4$, where R represents alkyl, aryl or $CF_3$;
2. $Ti(NHR)_4$, where R represents alkyl, aryl or $CF_3$;
3. $Ti(NR_2)_2R'_2$, where R represents alkyl, and R' represents alkyl, aryl or $CF_3$.

The titanium-nitrogen ratio and the short range order of the structure of the titanium nitride film being deposited can be adjusted by a suitable selection of the starting compound, by modification of the R, R' radical, by variation of the parameters of the deposition process, and optionally by adding gaseous nitrogen or ammonia.

The chamber 3 advantageously also has at least two electrodes for generating a plasma, and a device, such as a suitable window, that enables optical excitation of gases introduced into the chamber. The organic, nitrogen containing titanium compound is introduced into the chamber by means of a carrier gas (such as $H_2$, $N_2$, Ar, He) or by suction. Furthermore, $H_2$, $N_2$ and $NH_3$ can be introduced into the chamber as process gases. The deposition of the titanium nitride film is effected in a temperature range from 200° C. to 550° C. (preferably 200° C. to 400° C.) at a pressure of from 10 to 100,000 Pa, using at least one of the aforementioned types of excitation.

In a preferred embodiment, $NH_3$ is used as a reducing agent, because TiN can be produced at lower temperatures (compared to $H_2$) using only thermal excitation, which enables a simple, secure and inexpensive process.

For example, $Ti[N(CH_3)_2]_4$ used as the organic, nitrogen-containing titanium compound from substance class 1, can be thermally decomposed, with $H_2$ and/or $NH_3$ as the reducing agent:

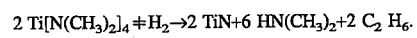

Through the addition of $N_2NH_3$, the deposition of a titaniumrich titanium nitride film can be suppressed. For the embodiments given, the parameters for the deposition process are in the following ranges:

Temperature 200°–550° C.
Pressure 10–100,000 Pa
RF power of the plasma excitation 0–800 W
Electrode spacing 0.3–1.5 cm
Carrier gas flow 0.600 sccm $N_2$, $H_2$, Ar or He
$N_2$ or $NH_3$ flow 0–300 sccm
$H_2$ flow 100–1000 sccm
Evaporation temperature 25°–120° C.
Deposition rate ≦500 nm/min.
(a4) Applying a CVD aluminum layer 14:

The application of the aluminum layer 14 with CVD occurs in the temperature range from 200° through 450° C. at a pressure of 0.1 mbar through 100 mbar (10 through 10,000 Pa). An organic aluminum compound 40 is utilized as an initial substance, for example dimethylaluminumhydride HAl (CH$_3$)$_2$, trimethylamine aluminum hydride AlH$_3$, N(CH$_3$)$_3$ or triethylaluminum Al(Et)$_3$ or the like. These compounds have evaporator temperatures in the range from 5° C. through 100° C. and are introduced into the process chamber 4 with a carrier gas or by imbibition. The properties of the aluminum such as grain size or surface roughness can be influenced both by a suitable selection of the initial constituents as well as by varying the process parameters.

(a5) Application of a layer 15 supplying alloy constituents:

For forming an aluminum alloy, a layer 15 that contains copper, titanium, palladium or silicon is sputtered on or deposited with CVD. Its thickness is determined by the desired alloy ratio. The application of the layer can also occur before the application of the aluminum layer.

(a6) Alloying the aluminum layer:

The desired aluminum alloy is formed with a temperature step, for example by rapid thermal processing (RTP). The diffusion of the alloy constituent thereby preferably occurs at temperatures below 500° C. on the basis of brief-duration heating of the semiconductor substrate (10 sec through 80 sec) in an inert gas atmosphere such as helium or hydrogen. The temperature step can also occur with optical assistance (rapid optical annealing, ROA) at temperatures up to 450° C. for 10 sec through 120 sec.

This exemplary embodiment of the method of the present invention makes it possible to deposit layers in conformity and with extremely good step coverage even in extremely narrow structures. This is enabled by the selection of suitable CVD or sputtering methods and by deposition parameters in the region of surface-controlled reaction kinetics, as well as because the layer constituents to be deposited in the CVD method are already present in a single initial molecule. Such a metallization method, as a result, is particularly suited for multi-layer wiring.

Unlike the films deposited by the known processes, the titanium nitride films deposited by the process according to the present invention are distinguished by substantially better barrier properties, even immediately after the deposition. Among other factors, this is due to the incorporation of carbon, because of which the films combine the known, advantageous barrier properties of titanium nitride and titanium carbide in themselves. As a result it is particularly unnecessary to partially oxidize the films after deposition by contact with air in order to improve the barrier properties as must be done in the sputtering process. The titanium nitride films produced by the process according to the present invention also have a dense structure that is lower in pores, and as a result they offer fewer paths for diffusion to occur. Through the use of a suitable selection of the deposition process parameters, films with minimal mechanical stress and a simultaneously dense, polycrystalline microstructure can be produced. This increases the reliability of the barrier layer, improves the adhesion of the titanium nitride film itself, and increases the compatibility with other layers. Due to these improved film properties, the process can be integrated with other prior or subsequent processes in the same high-vacuum system, which is a particular advantage over all the known processes in view of the object of the present invention.

In the case of other embodiments, plasma excitation by ignition of a plasma between two electrodes, or optical excitation of the nitrogenated organic titanium compound, with which the N—C bond, for instance, is purposefully cleaved, can be used instead of or in addition to the thermal excitation.

The manufacturing method for the aluminum layer 14 does not use any hazardous or highly reactive initial substances. The particular advantage is in the combination of the titanium nitride deposition with the immediately following aluminum deposition without interrupting the high-vacuum since, contrary to expectations, a nucleation layer is not needed for the aluminum deposition. Aluminum is deposited extremely uniformly and independently of the underlying material on the non-oxidized titanium nitride surface. Smaller average aluminum grain size, smoother layers and a lower imperfection density of the aluminum layer are achieved as compared to previously known aluminum deposition processes. The electromigration resistance and the reliability of the metallization are also significantly better and can be further enhanced, for example by applying a titanium nitride cover layer onto the aluminum layer or by applying corresponding intermediate layers within the aluminum layer. Copper or titanium as an underlying, intermediate or cover layer also provides a further improvement of the electrical properties of the metallization, particularly in combination with temperature steps. The production of aluminum alloy layers can also occur in situ by decomposing suitable initial compounds (for example AlH$_3$* N(CH$_3$)$_3$+Si$_2$H$_6$) in a CVD process.

A further advantage of the described metallization method that is particularly important for multi-layer wiring is that all deposition steps can be executed at temperatures below 450° C., i.e. these steps can also be implemented on semiconductor substrates that already have an aluminum layer.

A simplified exemplary embodiment of the method of the present invention is a limitation to the method stages (a3) and (a4). The most significant advantages involved with the present invention are achieved by integrating these two method stages in a high-vacuum system while maintaining the high-vacuum conditions for the semiconductor substrate.

2. Manufacture of Silicides

Figure 3:
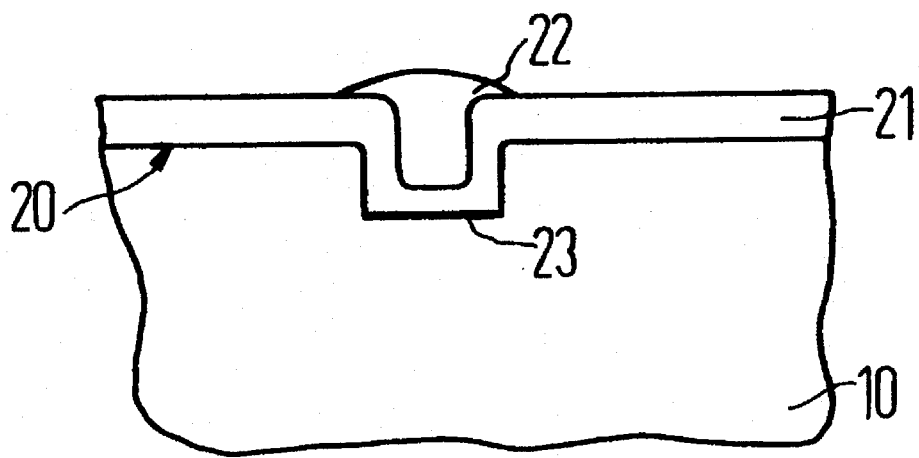

Silicides are utilized in silicon technology in order to produce temperature-stable, low-impedance interconnects and contacts, particularly self-aligned contacts as well (what are referred to as salicides). This is set forth in greater detail, for example, in the book by D. Widmann, H. Mader and H. Friedrich, Technologie Hochintegrierter Schaltungen, Springer Verlag 1988, pages 95–98. Producing silicides and salicides is possible in a simple manner with the method of the present invention by utilizing method stages (b1) through (b3) shown in FIG. 3. Further, a selective metal deposition, for example for filling up through holes, can be undertaken immediately thereafter with a further method stage (b4):

(b1) Pre-treatment of the surface:

In the first process chamber 1 which is filled with Ar, the surface 20 to be coated is cleaned by being bombarded with, for example, low-energy argon ions (approximately 100 eV); the natural oxide is thereby removed, particularly in the later through hole region and on the polysilicon of gate contactings. Simultaneously with this cleaning of the surface, an incorporation of argon atoms of approximately <10$^{13}$ atoms per cm$^2$ occurs. The silicon is pre-amorphized. A uniform silicidation of the layers is thereby achieved independently of the doping.

(b2) Sputtering a metal layer on:

In another chamber or in the same chamber of the high-vacuum system, the metal layer 21 required for the formation of the silicide is deposited on the newly cleaned surface by sputtering from a high-purity metal target without vacuum interruption. Also the use of CVD for depositing e.g. the Ti metal layer is within the scope of the invention.

The layer thickness is dependent on the geometrical relationships of the through hole, on the doping profile as well as on the pre-treatment and typically lies between 40 nm and 80 nm.

(b3) Temperature treatment:

The silicide formation occurs with a rapid thermal processing (RTP) or vertical furnace annealing, for example at 650° C. through 700° C. in a nitrogen atmosphere for 30 seconds or some minutes respectively in one chamber of the high-vacuum system. As a result of maintaining the high-vacuum condition, no oxide layer forms on the metal layers 21 deposited in stage (b2).

(b4) Selective metal deposition: Again without interrupting the high-vacuum, a selective metal 22 deposition of, for example, tungsten, copper or aluminum can now be implemented with a CVD process on the newly silicized contacts 23 without nucleation delay and with excellent selectivity. To that end, a further chamber of the high-vacuum system and a selective deposition process in conformity with the prior art is utilized.

3. Selective Metal Deposition

As a further exemplary embodiment of the present invention, the method stages (a1) and (b4) that have been previously described can be combined. A selective metal deposition of, for example, tungsten, copper or aluminum on newly cleaned contacts is implemented with this multi-stage method for contacting underlying silicon or underlying metallic interconnects. The planarization of the surface is achieved on the basis of a complete filling of the contacts.

Regardless of the respective exemplary embodiment, the inventive concept is comprised in the combination of at least two method stages while maintaining the high-vacuum conditions for the semiconductor substrate. The multi-chamber high-vacuum system of the present invention is required for the implementation. The individual method stages can thereby be implemented in conformity with the prior art, this being particularly true for the method stages (a1), (a2), (a5), (a6), and method stages (b1) through (b4) as set forth in the exemplary embodiments. By contrast thereto, the method stage (a4) is new and the method stage (a3) as well as the combination of method stages (a3) and (a4) are new and inventive.

The invention is not limited to the particular details of the apparatus and method depicted and other modifications and applications are contemplated. Certain other changes may be made in the above described apparatus and method without departing from the true spirit and scope of the invention herein involved. It is intended, therefore, that the subject matter in the above depiction shall be interpreted as illustrative and not in a limiting sense.

What is claimed is:

1. A multi-stage method for producing conductive layers for VLSI circuits on a semiconductor substrate, a conductive layer at least partially covering a surface of the substrate, the method having at least two method stages in at least two chambers of a high-vacuum system while maintaining the high-vacuum conditions for the semiconductor substrate, in a plurality of method stages, the method comprising the steps of:

plasma etching a surface of the semiconductor substrate for removing oxides;

applying a titanium layer 10 through 100 nm thick on the surface of the semiconductor substrate using a sputtering process or by chemical deposition from a vapor phase at a temperature in the range from 200° C. through 450° C.;

applying a titanium nitride layer with a CVD process at a temperature of 200° C. through 450° C. using a nitrogen-containing, organic titanium compound that is excited by one of thermal, optical and plasma excitation;

applying one of an aluminum layer or an aluminum alloy layer with a CVD process at a temperature from 200° C. through 450° C. using an organic aluminum compound that is excited by at least one of thermal, optical and plasma excitation;

applying a metallic layer that contains at least one of copper, refractory metal palladium, and silicon with a sputtering process or a CVD process; and brief-duration heating of the semiconductor substrate to a temperature up to 500° C. for 10 seconds through 120 seconds in an inert gas atmosphere for alloy formation.

2. The method according to claim 1, wherein the method step of applying the titanium nitride layer comprises adding a reducing agent selected from the group consisting of hydrogen and ammonia.

3. The method according to claim 2, wherein ammonia is selected as the reducing agent and thermal excitation of the nitrogen-containing organic titanium compound is provided at a temperature of 200° C. through 400° C.

* * * * *